US008509721B2

United States Patent
Canpolat et al.

(10) Patent No.: US 8,509,721 B2
(45) Date of Patent: Aug. 13, 2013

(54) HYSTERESIS NONLINEAR STATE MACHINE WITH OVERLAPPING THRESHOLDS FOR AUTOMATIC FREQUENCY CONTROL

(75) Inventors: Onur Canpolat, Kitchener (CA); Francis Chukwuemeka Onochie, Kitchener (CA)

(73) Assignee: Research In Motion Limited, Waterloo, Ontario (CA)

( * ) Notice: Subject to any disclaimer, the term of this patent is extended or adjusted under 35 U.S.C. 154(b) by 947 days.

(21) Appl. No.: 12/614,683

(22) Filed: Nov. 9, 2009

(65) Prior Publication Data

US 2011/0111718 A1 May 12, 2011

(51) Int. Cl.
*H04B 1/06* (2006.01)

(52) U.S. Cl.
USPC ........... 455/255; 455/258; 455/260; 455/318; 331/17; 375/376

(58) Field of Classification Search
USPC ............... 455/255–265, 313–318, 130, 139, 455/141, 183.1, 183.2, 183.3, 180.3, 205, 455/208–209; 331/17, 10, 18, 16; 375/376, 375/375; 327/156, 147, 12, 162, 163
See application file for complete search history.

(56) References Cited

U.S. PATENT DOCUMENTS

| | | | |
|---|---|---|---|
| 4,612,515 A | 9/1986 | Ohkawa et al. | |
| 5,440,252 A | 8/1995 | Lee | |
| 6,531,926 B1 * | 3/2003 | Pate et al. | 331/17 |
| 6,812,760 B1 * | 11/2004 | Kim et al. | 327/158 |
| 6,987,424 B1 * | 1/2006 | Hein | 331/53 |
| 7,038,511 B2 * | 5/2006 | Kim et al. | 327/158 |
| 7,049,869 B2 * | 5/2006 | d'Haene et al. | 327/165 |
| 7,078,950 B2 * | 7/2006 | Johnson | 327/158 |
| 7,119,583 B2 * | 10/2006 | Johnson et al. | 327/12 |
| 7,336,106 B2 | 2/2008 | Johnson et al. | |
| 7,573,348 B2 * | 8/2009 | Bauernfeind et al. | 332/126 |
| 7,825,706 B2 * | 11/2010 | Smith et al. | 327/156 |
| 7,907,018 B2 * | 3/2011 | Pellerano et al. | 331/16 |
| 8,259,891 B2 * | 9/2012 | Miller et al. | 375/376 |
| 2007/0268828 A1 | 11/2007 | Peng | |

FOREIGN PATENT DOCUMENTS

| | | |
|---|---|---|
| WO | WO 03/023967 A1 | 3/2003 |
| WO | WO 2007/057911 | 5/2007 |

* cited by examiner

*Primary Examiner* — Pablo Tran
(74) *Attorney, Agent, or Firm* — Gowling Lafleur Henderson LLP (57) ABSTRACT

A method and apparatus for non-linear frequency control tracking of a control loop of a voltage controlled oscillator (VCO) in a wireless mobile device receiver is provided. A channel metric based on one or more channel quality indicators associated with a received radio frequency channel is determined and a state metric associated with the current operating state of the control loop are determined. One or more state metric threshold value associated with the determined channel metric, providing hysteresis between operating states, are determined wherein each state metric threshold value is associated with a transition to a possible operating state of the control loop. The control loop transitions from the current operating state to the operating state associated with an exceeded state metric threshold value. Coefficients are provided to an adaptive loop filter of the control loop, wherein the coefficients coefficient are associated with the transitioned operating state.

8 Claims, 6 Drawing Sheets

HYSTERESIS NONLINEAR STATE MACHINE WITH OVERLAPPING THRESHOLDS FOR AUTOMATIC FREQUENCY CONTROL

TECHNICAL FIELD

The present disclosure relates to frequency tracking in wireless mobile devices and in particular to improving the performance of tracking in automatic frequency control of voltage controlled oscillator in the frequency tracking process.

BACKGROUND

In wireless mobile devices, conventional non-linear control system for automatic frequency control (AFC) of a voltage-controlled oscillator (VCO) is required for synchronization with a received radio frequency channel. This requires frequent switching or correction depending on the operating state of the wireless device. Variability in the RF channel quality during different phases such as initialization, cell hand-offs or deep channel fades can require frequent switching back and forth between control states which can lead to instability and phase jitter in the tracking process. In VCO control system the adjustment of the filter coefficients in the adaption process has to ensure optimum tracking performance for both transient and steady state response as well as stability. The inability to provide the appropriate filter coefficients based upon the current operating state in the wireless devices results in processing delays and inefficient resource utilization.

Accordingly, methods and apparatus that enable improved automatic frequency control remains highly desirable.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

Embodiments are described below, by way of example only, with reference to FIGS. 1-6.

In accordance with the present disclosure there is provided a method of non-linear frequency control tracking of a control loop of a voltage controlled oscillator (VCO) in a wireless mobile device receiver. A channel metric based on one or more channel quality indicators associated with a received radio frequency channel is determined. A state metric associated with the current operating state of the control loop is determined. One or more state metric threshold values associated with the determined channel metric, the one or more state metric threshold values selected from a plurality of state metric threshold values each associated with a transition to a possible operating state of the control loop, from the current operating state is determined. It is then determined if one of the one or more state metric threshold values has been exceeded based upon the determined state metric, wherein the state metric threshold is defined for each transition between each of operating states. The control loop then transitions from the current operating state to the operating state associated with the exceeded threshold value. At least one coefficient is provided to an adaptive loop filter of the control loop, the at least one coefficient associated with the transitioned operating state. The state metric thresholds values is associated with the operating states provide overlapping region between common operating states to provide hysteresis for operating state transitions.

In accordance with another aspect of the present disclosure there is provided an apparatus for providing hysteresis non-linear frequency tracking of a control loop in a frequency generator of a wireless mobile device having a voltage controlled oscillator (VCO) and an adaptive loop filter. The apparatus comprising a memory and a processor. The processor providing coefficients to an adaptive loop filter from a plurality of coefficients, each of the plurality of coefficients associated with an operating state of the frequency generator. The operating state is determined by determining a channel metric based upon one or more channel quality indicators associated with a received radio frequency channel. A state metric associated with the control loop based on the operating state of the control loop is determined. One or more state metric threshold values associated with the determined channel metric from a table stored in the memory, the one or more state metric threshold values selected from a plurality of state metric thresholds values each associated with a transition to a possible operating state of the control loop from the current operating state is determined. If one of the one or more state metric threshold values is determined to have been exceeded based upon the determined state metric, wherein the state metric threshold is defined for each transition between each of operating states. The control loop then transitions from current operating state to the operating state associated with the exceeded threshold value. The state metric thresholds associated with the operating states provide overlapping region between common operating states to provide hysteresis for operating state transitions.

The present disclosure provide a system and apparatus for providing non-linear frequency tracking of a frequency generator in a wireless device using overlapping thresholds in state transitions to create hysteresis between operating states. The hysteresis state machine controls the adaptive loop filter coefficients during the frequency tracking process. The ability to change the adaptive loop filter coefficients results in fast transient response for reaching the steady state and narrows the loop bandwidth to minimize the output phase jitter due to noisy frequency estimates.

Figure 1:
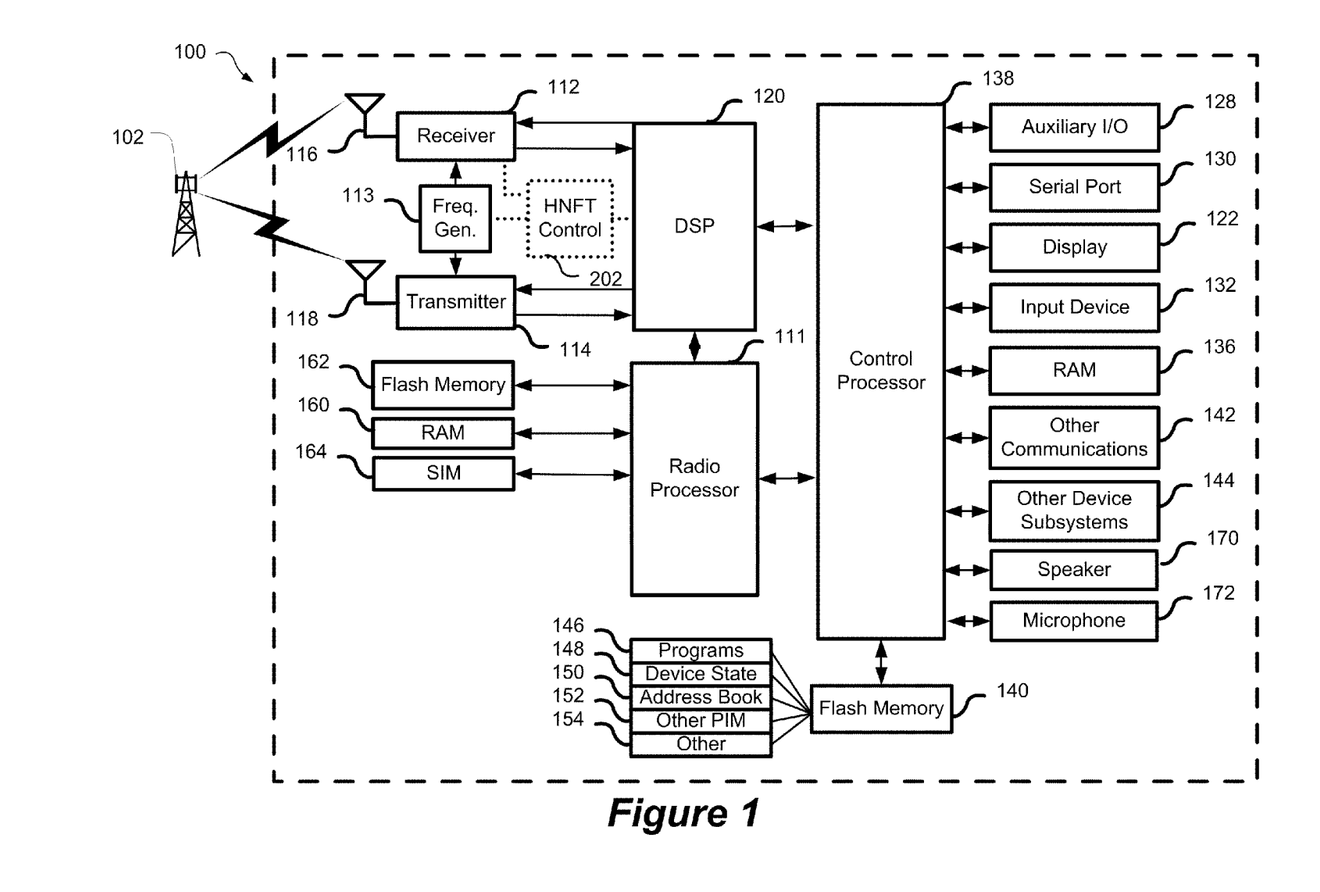
FIG. 1 shows a block diagram representation of wireless mobile device.

FIG. 1 is a block diagram of a wireless mobile device 100 incorporating a communication subsystem having both a receiver 112 and a transmitter 114, as well as associated components such as one or more embedded or internal antenna elements 116 and 118, frequency generator 113 which also includes a control loop for tuning a voltage controlled oscillator (VCO), and a processing module such as a digital signal processor (DSP) 120. The particular design of the communication subsystem will be dependent upon the communication network in which the device is intended to operate in a wireless network such as GSM, CDMA, HSPA, or 3GPP LTE network.

The wireless mobile device 100 performs synchronization, registration or activation procedures by sending and receiving communication signals over the network 102. Signals received by antenna 116 through communication network 102 are input to receiver 112, which may perform such common receiver functions as signal amplification, frequency down conversion, filtering, channel selection and the like, and in the example system shown in FIG. 1, analog to digital (ND) conversion. A/D conversion of a received signal allows more complex communication functions such as demodulation, decoding and synchronization to be performed in the DSP 120.

In a similar manner, signals to be transmitted are processed, including modulation and encoding for example, by DSP 120 and input to transmitter 114 for digital to analog conversion, frequency up conversion, filtering, amplification and transmission over the communication network 102 via antenna 118. DSP 120 not only processes communication signals, but also provides for VCO AFC control, as well as receiver and transmitter control.

Wireless device 100 preferably includes a radio processor 111 and a control processor 138 which together control the overall operation of the device. DSP 120 may be located within radio processor 111. Communication functions are performed through radio processor 111. If the DSP 120 is separate from radio processor 111, functions of the VCO AFC control may be shared in whole or in part between the processors.

Radio processor 111 interacts with receiver 112 and transmitter 114, and further with the subscriber identity module 164. The radio processor 111 may also interact with flash memory 162, random access memory (RAM) 160, which may be external components or integrated within the radio processor 111.

Control processor 138 interacts with further device subsystems such as the display 122, flash memory 140, random access memory (RAM) 136, auxiliary input/output (I/O) subsystems 128, serial port 130, keyboard 132 or a touch interface, other communications 142, other device subsystems generally designated as 144 and transmits and receives audio from a speaker 170 and a microphone 172.

Some of the subsystems shown in FIG. 1 perform communication-related functions, whereas other subsystems may provide "resident" or on-device functions. Notably, some subsystems, such as keyboard 132 and display 122, for example, may be used for both communication-related functions, such as entering a text message for transmission over a communication network, and device-resident functions such as a calculator or task list.

Software used by radio processor 111 and microprocessor 138 is preferably stored in a persistent store such as flash memory 140 and 162, which may instead be a read-only memory (ROM) or similar storage element (not shown). Those skilled in the art will appreciate that the operating system, specific device applications, or parts thereof, may be temporarily loaded into a volatile memory such as RAM 136 and RAM 160.

As shown, flash memory 140 can be segregated into different areas for computer programs 146, device state 148, address book 150, other personal information management (PIM) 152 and other functionality generally designated as 154. These different storage types indicate that each program can allocate a portion of flash memory 140 for their own data storage requirements. Control processor 138, in addition to its operating system functions, preferably enables execution of software applications on the mobile station.

For voice communications, overall operation of wireless mobile device 100 is similar, except that received signals would preferably be output to the speaker 170 or headset and signals for transmission would be generated by the microphone 172. Alternative voice or audio I/O subsystems, such as a voice message recording subsystem, may also be implemented on mobile network 102.

Serial port 130 in FIG. 1 would normally be implemented in a personal digital assistant (PDA)-type wireless mobile device for which synchronization with a user's desktop computer (not shown) may be desirable, but is an optional device component. Such a port 130 would enable a user to set preferences through an external device or software application and would extend the capabilities of wireless mobile device 100 by providing for information or software downloads to wireless mobile device 100 other than through a wireless communication network. The alternate download path may for example be used to load an encryption key onto the device through a direct and thus reliable and trusted connection to thereby enable secure device communication.

Other device subsystems 144, such as a short-range communications subsystem, is a further optional component which may provide for communication between wireless mobile device 100 and different systems or devices, which need not necessarily be similar devices. For example, the subsystem 144 may include an infrared device and associated circuits and components or a Bluetooth™ communication module to provide for communication with similarly enabled systems and devices.

The mobile device 100 further includes an Hysteresis Non-Linear Frequency Tracking (HNFT) Control 202, as described further herein, for controlling the frequency generator 113.

Figure 2:
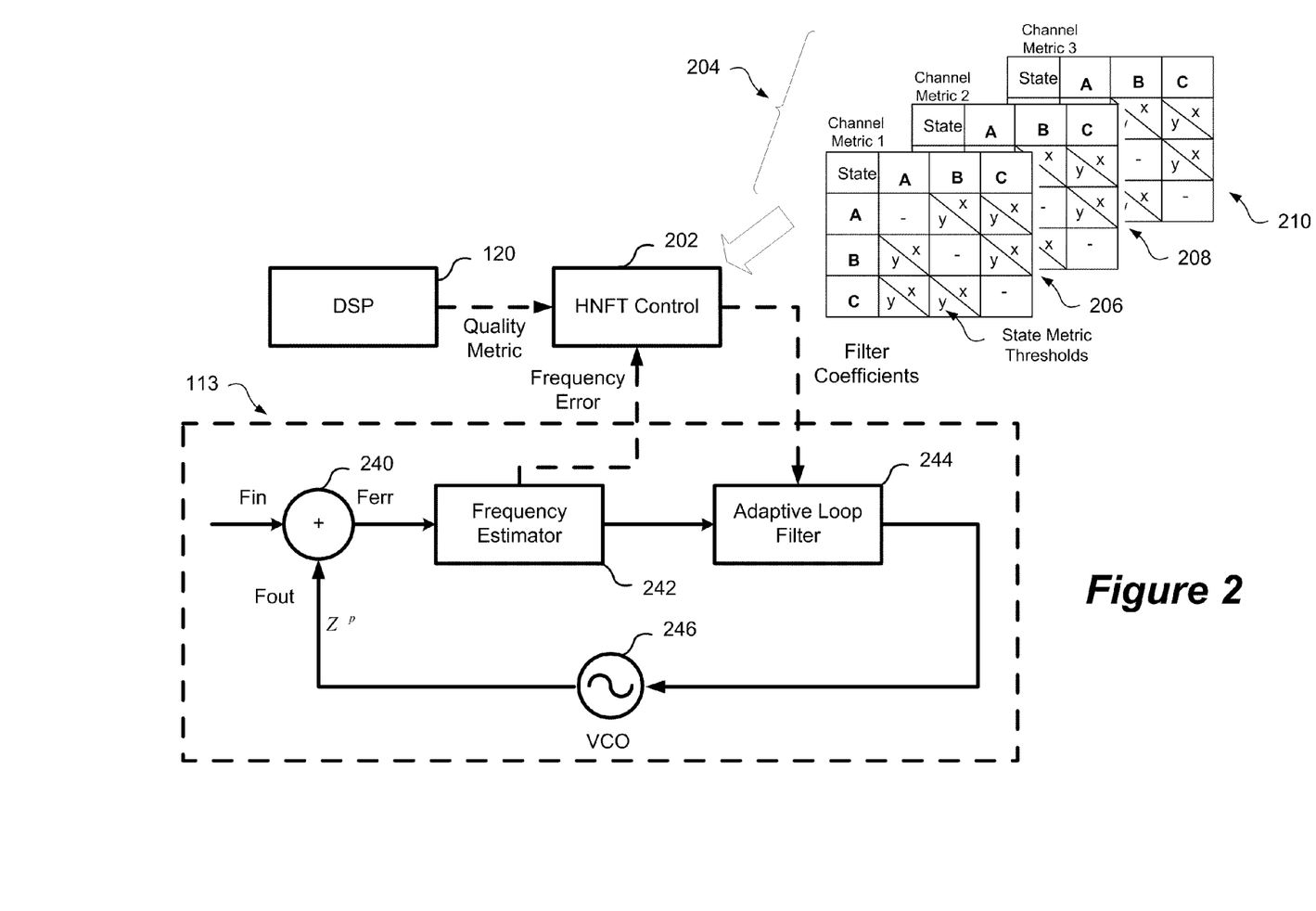
FIG. 2 shows a representation of a hysteresis non-linear frequency control loop.

FIG. 2 provides an overall control loop model with Hysteresis Nonlinear Frequency Tracking (HNFT) Control as provided in wireless mobile device 100. The frequency generator 113 generates a signal provided to the receiver 112 and transmitter 114. The frequency generator 113 compares the output signal of a VCO 246, having frequency (Fout), with the incoming signal, having frequency (Fin), from the received RF channel at a phase detector 240. The output of the phase detector 240 is provided to a frequency estimator 242 to estimate the frequency difference between the two signals. The output of the frequency estimator 242 is noisy and requires filtering by an adaptive loop filter 244. However the bandwidth of the filter 244 can be adjusted by providing optimum coefficients based upon the order and type of the filter selected to improve system performance.

The HNFT control 202 module provides the ability to determine the appropriate coefficients for the adaptive loop filter based upon channel and state metrics. The control loop can then change from different states of operation based upon the current operating environment of the wireless device to provide more accurate VCO 246 control and limit possible instability and phase jitter that can result from coefficients that are inappropriate for current channel characteristics. The HNFT control 202 receives channel quality indicators from the DSP 120 such as but not limited to signal-to-noise ratio of the received channel, bit-error rate of the received channel, a received signal strength measurements, and carrier-to-interference-plus-noise ratios (C/I+N) to determine a channel metric. The channel metric can be determined by generating a weighted function of one or more of the channel quality indicators, where each of the channel quality indicators is assigned a different weight to determining the channel metric function. The selection of the channel quality indicators may be based upon possible output data available from the DSP terms of channel quality in processing the received signal. In addition the decision of which parameter to use may be related to the received signal type or RF characteristics associated with the operation of the wireless device on the network.

A state metric is also determined based upon the received frequency error but may also include a weighted function of the current channel metric and/or weightings associated with one or more previous states that the HNFT has transitioned through. The previous state values may also be weighted based upon a time value in relation to how long ago the previous state transition occurred. Knowledge of the previous operating state may be useful when determining the optimal operating state, and so the filter coefficients, during operational transitions such as initialization, hand-offs or fades where the signal characteristics can vary considerably and benefit from further defining which state may be desirable or undesirable if as the transition occurs.

Each operating state is associated with filter coefficients which are provided to the adaptive loop filter 244 when transitioning to the determined state by the HNFT control module 202. The HNFT control module 202 utilizes the determined channel metric to select an associated channel metric table 204 which may comprise multiple sub-tables 206, 208, 210 each associated with a channel metric values or a range of channel metric values. Each table provides state metric threshold values defining transitions between operating states. The threshold values are used for determining when to transitions from one operating state to the next state in relation to the determined state metric for a given channel metric or a range of channel metrics. Each of the operating states have defined filter coefficients associated with the operating state to change the filtering properties of the adaptive loop filter 244. The number of coefficients is based upon the order and operation of the adaptive loop filter. The table defines a different threshold value for transitioning from a first operating state to a second operating state and a transitioning from the second operating state to the first operating state.

Figure 3:
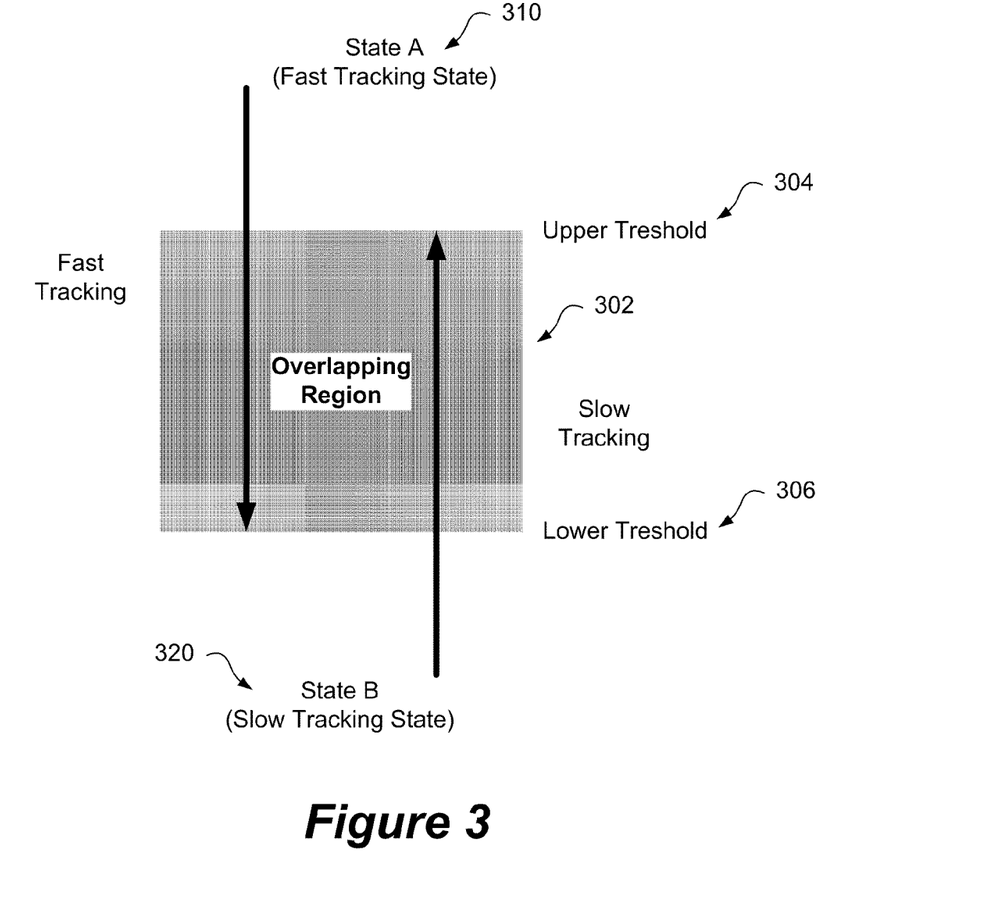
FIG. 3 shows a representation of overlapping thresholds used at state transitions in a hysteresis two-state machine.

FIG. 3 is an example of an operating state transition from fast to slow and slow to fast states in the state machine. In the simplest implementation two operating state transitions, operating state A 310 and operating state B 320 would be provided. The operating states may represent a fast tracking state and a slow tracking state respectively and each have different filter coefficient requirements associated with the operating state. When the control loop is in the fast tracking state A 310, a lower threshold is determined for when to transition to the slow tracking state B 320. The threshold is based upon the determined channel and state metrics. This threshold is not the same as when the control loop is in slow tracking state B 320 and the channel and state metric varies sufficiently to require a state change to the fast tracking state A 310. The overlapping between states 302 provides and upper threshold 304 and lower threshold 306 where hysteresis occurs in the state transitions to ensure that filter coefficients are not loaded prematurely to reduce instability and phase jitter. As shown in the figure there is an overlapping region where both states can operate separately to reduce phase jittering and switching operating states back and forth.

Figure 4:
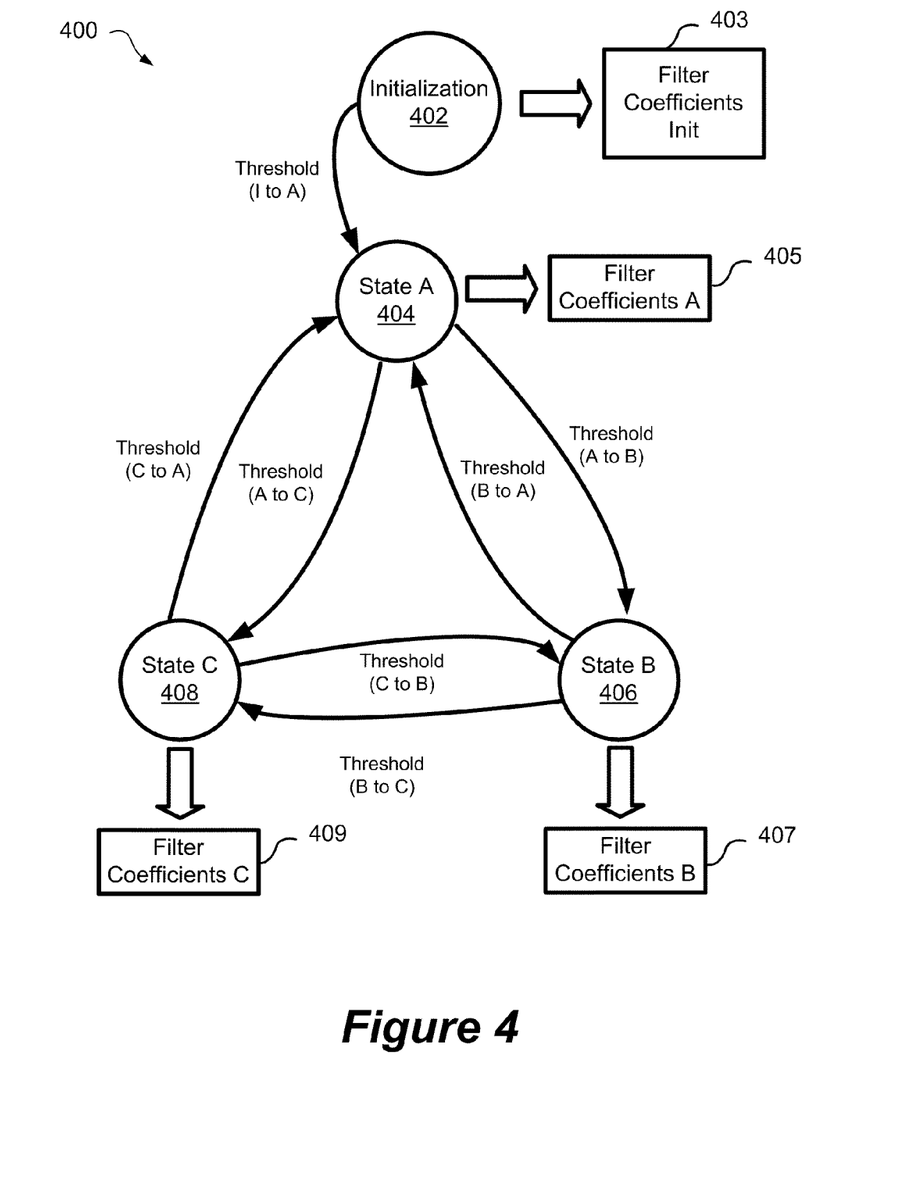
FIG. 4 shows a hysteresis three-operating state diagram for non-linear frequency tracking.
Figure 5:
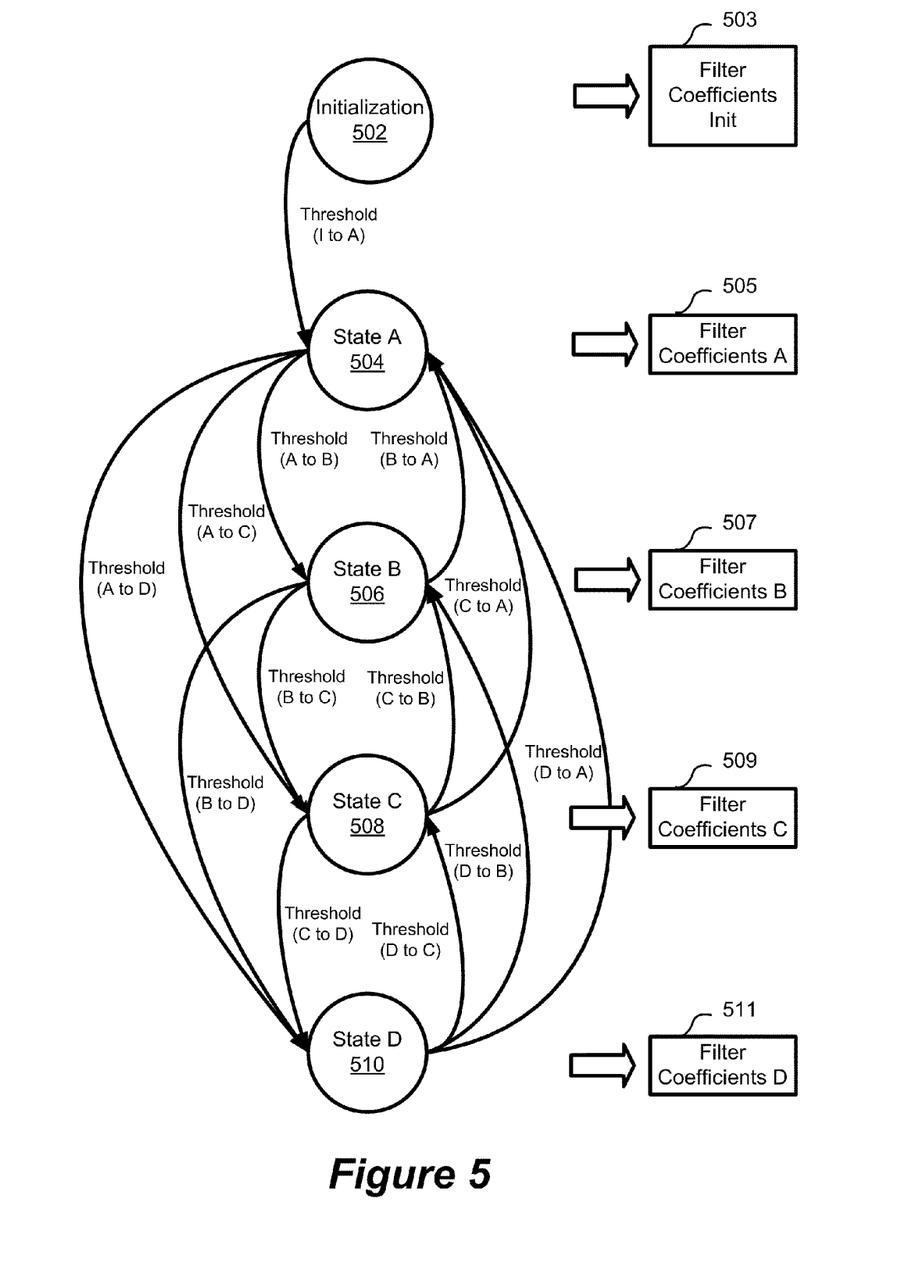
FIG. 5 shows hysteresis four-operating state diagram for non-linear frequency tracking.

FIGS. 4 & 5 show a three and four operating state diagrams respectively including an initialization state in accordance with the present disclosure. The states are not limited to the ones provided and can be expanded to include additional states based upon the filter requirements such as the order of the filter and overall performance requirements.

FIG. 4 shows a hysteresis three operating state diagrams for non-linear frequency tracking 400. Initialization state 402 provides filter coefficients for an initialization phase 403 to optimize single acquisition. To move from the initialization state a threshold (I to A) is defined, there is no hysteresis back to the initialization state as it is assumed that the initialization state will only occur at start-up and will not be transitioned back to during normal operation. It should be understood that an initialization operating state 402 may not be required by the HNFT control module 202 based upon how the operating states are defined in relation to the channel and state metric. For each of the operating states, associated thresholds are defined in the table 204 for each defined channel metric or channel metric ranges.

Operating state A 404 having filter coefficients A 405 would have two state metric threshold states associated with it for a given channel metric:
    moving to state B threshold is (A to B)
    moving to state C threshold is (A to C)

Operating state B 406 having filter coefficients B 407 would have two state metric threshold states associated with it for a given channel metric:
    moving to state A threshold is (B to A)
    moving to state C threshold is (B to C)

Operating state C 408 having filter coefficients C 409 would have two state metric threshold states associated with it for a given channel metric:
    moving to state A threshold is (C to A)
    moving to state B threshold is (C to B)

In a three-state machine, the HNFT control provides state metric thresholds to transition to and from each operating state based upon the associated determined channel metric.

FIG. 5 shows a hysteresis four operating state diagram for non-linear frequency tracking 500. Initialization state 502 provides filter coefficients for an initialization phase 503 to optimize single acquisition. To move from the initialization state a threshold (I to A) is defined, there is no hysteresis back to the initialization state as it is assumed that the initialization state will only occur at start-up and will not be transitioned back to during normal operation. It should be understood that an initialization operating state 502 may not be required by the HNFT control module 202 based upon how the operating states are defined in relation to the channel and state metric. For each of the operating states associated state metric thresholds are defined in the table 204.

Operating state A 504 having filter coefficients A 505 would have three state metric threshold states associated with it for a given channel metric:
    moving to state B threshold is (A to B)
    moving to state C threshold is (A to C)
    moving to state D threshold is (A to D)

Operating state B 506 having filter coefficients B 507 would have three state metric threshold states associated with it for a given channel metric:
    moving to state A threshold is (B to A)
    moving to state C threshold is (B to C)
    moving to state D threshold is (B to D)

Operating state C 508 having filter coefficients C 509 would have three state metric threshold states associated with it for a given channel metric:
    moving to state A threshold is (C to A)
    moving to state B threshold is (C to B)
    moving to state D threshold is (C to D)

Operating state D 510 having filter coefficients C 511 would have three state metric threshold states associated with it for a given channel metric:
    moving to state A threshold is (D to A)

moving to state B threshold is (D to B)
moving to state C threshold is (D to C)

Figure 6:
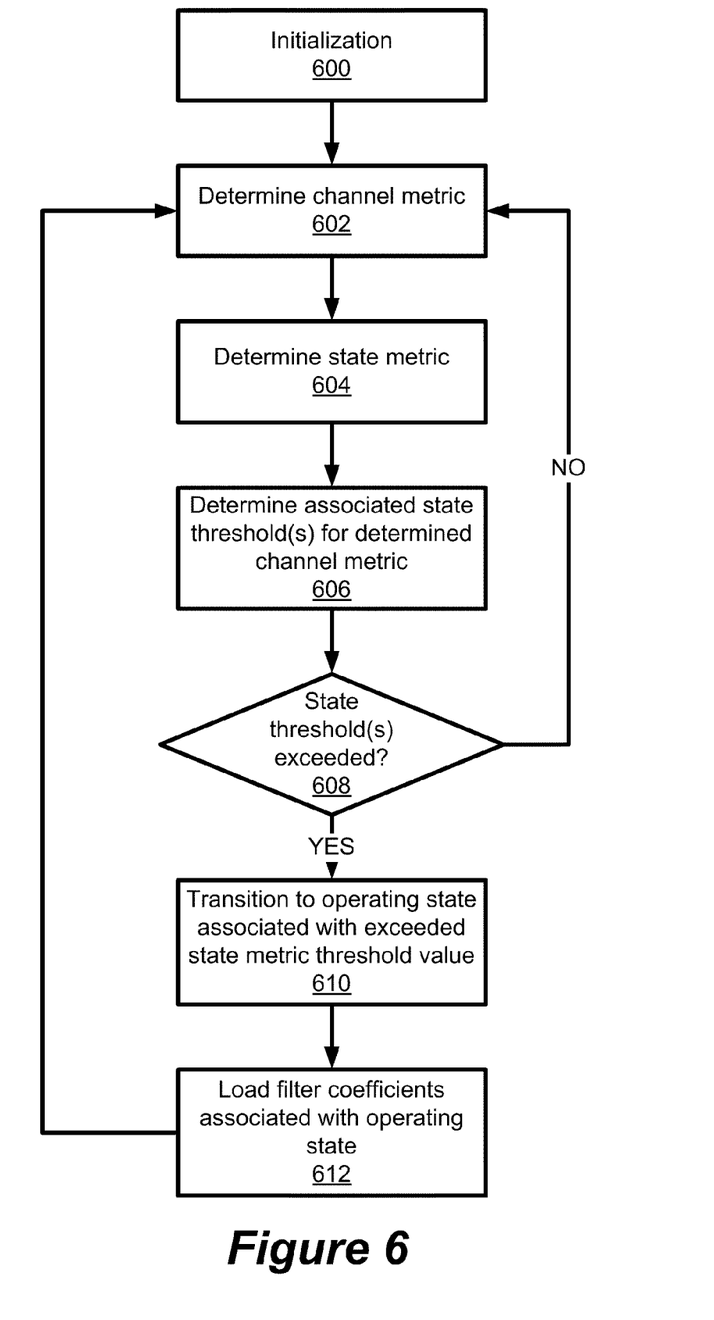
FIG. 6 shows a method for hysteresis non-linear frequency tracking.

FIG. 6 is a method of non-linear frequency control of a control loop of a voltage controlled oscillator (VCO) provided by a frequency generator in a wireless mobile device. The method may be implemented by a processor resident within the wireless mobile device such as the DSP 120, by a dedicated processor, or utilizing processing power of radio processor 111 or control processor 138. If the mobile wireless device is in the initialization phase 600, it loads initialization coefficients in to the adaptive loop filter as a default filter configuration. When the defined threshold for the channel metric is exceeded during the initialization state, the HNFT control 202 transitions to the first operating state. A channel metric associated with a received radio frequency channel is then determined 602. The channel metric generated as a weighted function of one or more channel quality indicators provided by the DSP 120. A state metric associated with the control loop is determined 604 as a weighted function of one or more parameters. The state metric may include a weighting of the frequency error of the VCO in relation to the received radio frequency channel, a weighted function of the determined channel metric, one or more previous state metrics associated with a previous operating state weighted by time relative to the current operating state. The time parameter provides a weight component to the previous operating state metric wherein the time parameter decreases the weighting of the previous operating state metric based on received radio frequency channel characteristics.

One or more state metric threshold values is then determined 606 based on the determined channel metric. The one or more state metric threshold values can be selected based upon the associated operating states transitions. The state metric threshold values can be provided in a table 204 defining operating state transitions for each of the states in the control loop. The state metric threshold defines the state metric value that must be exceeded in order to transition to the next operating state based upon the channel metric value. The channel metric table 204 can be stored in memory 162 or 160 or may be resident within the DSP. If the one of the one or more threshold values is exceeded 608, based on the determined state metric, the control loop transitions to the operating state, YES at 608, associated with the threshold 610. For a new operating state, at least one coefficient is loaded 612 to the adaptive loop filter of the control loop. Depending on the order adaptive filter, the number of coefficients provided may vary for each operating state. The state metric threshold values are selected to provide a hysteresis function to transitions between operating states to remove instability and improved transient response. The method continues with the channel metric again being determined at 602. If thresholds are not exceeded, NO at 608, the channel metric is again determined at 602 until a transition occurs.

While a particular embodiment of the present method and apparatus for Hysteresis Non-Linear Frequency Tracking has been described herein, it will be appreciated by those skilled in the art that changes and modifications may be made thereto without departing from the disclosure in its broadest aspects and as set forth in the following claims.

The invention claimed is:

1. A method of non-linear frequency control tracking of a control loop of a voltage controlled oscillator (VCO) in a wireless mobile device receiver, the method comprising:
   determining a channel metric based on one or more channel quality indicators determined from a received radio frequency channel and is a function of one or more channel quality indicators selected from a signal-to-noise ratio of the received channel, bit-error rate of the received channel, a received signal strength measurements, and carrier-to-interference-plus-noise ratios (C/I+N) wherein each of the one or more channel quality indicators has an associated weighting in determining the channel metric;
   determining a state metric associated with the current operating state of the control loop, the state metric comprises a function of a frequency error between the frequency of the received radio frequency channel and an output frequency of the VCO and at least one of:
      a weighted function of the current channel metric; and
      one or more previous operating state metrics weighted by a time parameter, wherein the time parameter decreases the weighting of the previous operating state metric;
   determining one or more state metric threshold values associated with the determined channel metric, the one or more state metric threshold values selected from a plurality of state metric threshold values each associated with a transition to a possible operating state of the control loop, from the current operating state;
   determining if one of the one or more state metric threshold values has been exceeded based upon the determined state metric, wherein the state metric threshold values is defined for each transition between each of operating states;
   transitioning from the current operating state to the operating state associated with the exceeded state metric threshold value; and
   providing at least one coefficient to an adaptive loop filter of the control loop, the at least one coefficient associated with the transitioned operating state;
   wherein the state metric threshold values associated with the operating states provide overlapping region between common operating states to provide hysteresis for operating state transitions.

2. The method of claim 1 wherein determining if one of the one or more state metric threshold values associated with the determined channel metric is performed by a lookup in a table defining state metric threshold values for each transition between the plurality of operating states.

3. The method of claim 2 wherein the lookup table comprises one or more sub-tables each table associated with a channel metric value or a range of channel metric values, the table defining the plurality of state metric thresholds for each transition to and from operating states.

4. The method of claim 1 wherein when determining one or more state metric threshold values is associated with an initialization state, providing default initialization coefficients defined for the adaptive loop filter and wherein only one threshold is defined for the channel metric and wherein the initialization state occurs during mobile wireless device start-up.

5. An apparatus for providing hysteresis non-linear frequency tracking of a control loop in a frequency generator of a wireless mobile device having a voltage controlled oscillator (VCO) and an adaptive loop filter, the apparatus comprising:
   a memory;
   a processor coupled to the memory, the memory containing instructions for providing coefficients to an adaptive loop filter from a plurality of coefficients, each of the plurality of coefficients associated with an operating state of the frequency generator wherein the operating state is determined by:

determining a channel metric based upon one or more channel quality indicators determined for a received radio frequency channel and is a function of one or more channel quality indicators selected from a signal-to-noise ratio of the received channel, bit-error rate of the received channel, a received signal strength measurements, and carrier-to-interference-plus-noise ratios (C/I+N) wherein each of the one or more channel quality indicators has an associated weighting in determining the channel metric;

determining a state metric associated with the control loop based on the operating state of the control loop wherein the state metric comprises a function of a frequency error between the frequency of the received radio frequency channel and an output frequency of the VCO and at least one of:

a weighted function of the current channel metric; and one or more previous operating state metrics weighted by a time parameter, wherein the time parameter decreases the weighting of the previous operating state metric;

determining one or more state metric threshold values associated with the determined channel metric from a table stored in the memory, the one or more state metric threshold values selected from a plurality of state metric threshold values each associated with a transition to a possible operating state of the control loop from the current operating state;

determining if one of the one or more state metric threshold values has been exceeded based upon the determined state metric, wherein the state metric threshold is defined for each transition between each of operating states; and transitioning from the current operating state to the operating state associated with the exceeded state metric threshold value;

wherein the state metric threshold values associated with the operating states provide overlapping region between common operating states to provide hysteresis for operating state transitions.

6. The apparatus of claim 5 wherein determining if one of the one or more state metric threshold values has been exceeded based upon the channel metric is performed by a lookup in a table defining one or more state metric threshold values for each of the plurality of operating states.

7. The apparatus of claim 6 wherein the lookup table comprises one or more sub-tables each table associated with a channel metric value or a range of channel metric values, the table defining the plurality of state metric threshold values for each transition to and from operating states.

8. The apparatus of claim 5 further comprising an initialization state, wherein default initialization coefficients are defined for the loop filter and wherein only one threshold is defined for the channel metric and wherein the initialization state occurs during mobile wireless device start-up.

* * * * *